US007067006B2

(12) United States Patent
Curatolo

(10) Patent No.: US 7,067,006 B2
(45) Date of Patent: Jun. 27, 2006

(54) OH AND H RESISTANT SILICON MATERIAL

(75) Inventor: Susana Curatolo, Lawrence, KS (US)

(73) Assignee: CZT Inc., Lawrence, KS (US)

( * ) Notice: Subject to any disclaimer, the term of this patent is extended or adjusted under 35 U.S.C. 154(b) by 190 days.

(21) Appl. No.: 10/480,042

(22) PCT Filed: Oct. 5, 2002

(86) PCT No.: PCT/US02/32003

§ 371 (c)(1),
(2), (4) Date: Dec. 9, 2003

(87) PCT Pub. No.: WO2004/005203

PCT Pub. Date: Jan. 15, 2004

(65) Prior Publication Data

US 2004/0165858 A1 Aug. 26, 2004

Related U.S. Application Data

(60) Provisional application No. 60/393,829, filed on Jul. 8, 2002.

(51) Int. Cl.
*C30B 1/02* (2006.01)

(52) U.S. Cl. .................... 117/3; 117/4; 117/7; 117/8; 117/10; 117/931; 117/944

(58) Field of Classification Search .............. 117/3, 117/4, 7, 8, 10, 931, 944
See application file for complete search history.

(56) References Cited

U.S. PATENT DOCUMENTS

| | | | |
|---|---|---|---|
| 5,692,087 A | 11/1997 | Partus et al. | |
| 5,881,200 A | 3/1999 | Burt | |
| 6,015,765 A | 1/2000 | Harbison et al. | |
| 6,304,583 B1 | 10/2001 | Ohmer et al. | |
| 6,350,397 B1 | 2/2002 | Heikkila et al. | |
| 6,400,866 B1 | 6/2002 | Ranka et al. | |
| 2004/0159647 A1 * | 8/2004 | Curatolo | 219/387 |

OTHER PUBLICATIONS

Rau, J. W. and Kannewurf, C. R., "Intrinsic absorption and photoconductivity in single crystal $SiTe_2$," *J. Phys. Chem. Solids* 27, 1097 (1966).
Bassani, F. and Parravicini, G. Pastori, "Band structure and optical properties of graphite and of the layer compounds GaS and GaSe," *Nuovo Cimento* 7 B, 95 (1967).
Balzarotti, A. and Piacentini, M., "Excitonic effect at the direct absorption edges of GaSe," *Solid State Comm*. 10, 421 (1972).
Stone, J. and Walrafen, G.E., "Overtone vibrations of OH groups in fused silica optical fibers," *J. Chem. Phys.* 76, 1712 (1982).
"Plastic Organic Light Emitting Displays," http://www.vitexsys.com/flexible.html (Sep. 2, 2002).
Thomas, G. A., et al., "Physics in the whirlwind of optical communications," *Physics Today*, pp. 30–36 (Sep. 2000).
De Córdoba, P. F., et al., "La nueva generación de fibras ópticas," *El Pais* (Jun. 2002).
Doni–Caranicola, E. G. and Lambros, A. P., "Use of single $SiTe_2$ crystals with a layered structure in optical filter design," *J. Opt. Soc. Am.* 73, 383 (1983).
Lambros, A. P. and Economou, N. A., "The optical properties of silicon ditelluride," *Phys. Stat. Sol. (b)* 57, 793 (1973).
Taketoshi, K., et al., "Structural studies on silicon ditelluride ($SiTe_2$)," *Jpn. J. Appl. Phys.* 34, 3192 (1995).
Graupner, W., et al., "High resolution color organic light emitting diode microdisplay fabrication method," *SPIE Proceedings* 4207, 11 (2000).
"SEI's New Optical Fiber Achieved Low Loss World Record," http://www.sei.co.jp/sn/2002/06/06p4t.html (Oct. 7, 2002).

* cited by examiner

*Primary Examiner*—Robert Kunemund
(74) *Attorney, Agent, or Firm*—Barnes & Thornberg LLP

(57) ABSTRACT

A method of forming a single crystalline structure having a substantially linear response at least over the wave lengths of 1,200 to 1,700 nanometers, the resulting structure and its use as an optical media or a barrier coating. Thus, maximum obtainable optical transmission with zero attenuation is provided. There is no intrinsic material absorption.

43 Claims, 10 Drawing Sheets

NIR attenuation of high-silica, single-mode telecommunication fibers.

Modal dispersion of transmitted signals in multimode and single-mode fibers.

OH AND H RESISTANT SILICON MATERIAL

This application claims the benefit of Provisional Application No. 60/393,829 filed Jul. 8, 2002.

BACKGROUND AND SUMMARY OF THE INVENTION

The present invention relates generally to an optical media or material capable of transmitting an optical signal and, more specifically, to such a material and a method of making a material which is hydroxyl ion (OH) and hydrogen (H) resistant.

Silicon dioxide glass or silica is one form of glass used in optical fibers because of its clarity. Other optical materials including silicon have been used. Silicon based fiber has transmission losses. These transmission losses have three components: OH absorption, Rayleigh scattering and the Urbach tail.

Silicon based material is a hydrophilic material, which absorbs OH. This absorption produces transmission losses. The transmission losses in general are shown as graph 10 in FIG. 1 from Ref. 1. That is a graph of transmission losses as a function of wavelength. OH absorption produces the peak at approximately 1400 nanometers, which is approximately one-half of the fundamental OH mode. The Rayleigh scattering effect is illustrated by curve 12. Rayleigh scattering is proportional to $1/\lambda^4$. Thus, the Rayleigh scattering is wavelength or $\lambda$ dependent. The scattering comes from the non-uniformities in the glass, which is disordered by its nature, even though the purity and homogeneity are carefully controlled during manufacturing. Light will scatter from any point where the refractive index varies. The Urbach contribution, as illustrated, produces the Urbach tail 14 beginning at approximately 1,600 nanometers. This results from the vibration of the silicon-oxygen (S—O) bond. The solid line 16 running across the bottom represents the sum of the Rayleigh and Urbach contributions, which may be the clarity limit in the silicon based glass.

Spatial spreading of light along the path of propagation is known as dispersion. Appropriate doping can be used to control dispersion. The dopant changes the index of refraction of the fiber by raising the index refraction. Confinement process is similar to internal refraction. Which dopant to use and how it is added is used to optimize all of the parameters associated with high capacity optical transmission systems. The particular configuration will determine the optimization of the interplay between dispersion and non-linearity.

The dependence of the loss mechanism on spectral wavelengths of silica standard (single) mode fibers SMF is illustrated in FIG. 2A. A comparison of the modal dispersion of transmitted signals in multimode and single-mode fibers is illustrated in FIG. 2B. See Ref 2.

Historically, optical systems have been designed around these limitations of the optical fiber by applying certain modifications and optimizations such as such as dispersion compensators, in-line amplifiers, etc. So, to reduce the transmission loss of fibers, various schemes have been used. These include cladding the basic fiber. Refs. 3 and 4 show two of the latest treatments to reduce intrinsic fiber loss.

Ref. 5 and Ref. 6 were one of the earliest attempts in doping silicon to produce a relatively high transmittance optical filter at desired wavelengths with relatively inexpensive cost, but still susceptible to water, as it is the case in the previous two Refs. Ref. 6 is the process used in Ref 5. Si and Te were heated at 1075° C. for 72 hours. The resulting structure of $SiTe_2$ had to be kept in a vacuum to prevent decomposition in the atmosphere through the interaction with water vapor. These are either costly in material cost, and or as well in the cost of manufacturing. More recent analysis is presented in Ref 7.

The present invention is a method of forming a single crystalline structure having a substantially linear response at least over the wave lengths of 1,200 to 1,700 nanometers, the resulting structure and its use as an optical media. Thus, maximum obtainable transmission with zero attenuation is provided. There is no intrinsic material absorption.

For silicon base materials, the method produces a hydroxyl ion (OH) resistant silicon material. The transmission versus wavelength response is flat with no absorption peaks between 1,000 nanometers to the Urbach tail at 2,000 nanometers, at a minimum. There is no second harmonic of the hydroxyl ion vibration peak at 1,400 nanometers. The Rayleigh scattering has been substantially eliminated.

An example of a silicon based material produced by the present method is a silica-tellurium single crystalline structure. The structure is $SiO_2Te_x$ where x is in the range of ⅓ to ⅔. The silica and tellurium structure includes twin crystal structures. The twining angle is 90 degrees. The method also includes silicon-tellurium single crystalline structures.

One method of the invention includes inserting two substances into a crucible and sealing the crucible in an envelope. The two substances are in an oven at a temperature and time sufficient to create a single crystalline material of the two substances having a substantially linear response at least over the wave lengths of 1,200 to 1,700 nanometers.

Another method includes inserting the two substances into a substantially spherical crucible. The crucible is sealed in a substantially spherical envelope. The two substances are heated in an oven at a temperature and time sufficient to create a single crystalline material of the two substances. Heating is carried out for a sufficient amount of time that all of the inserted material is converted to a single crystalline material of the two substances. The opening in the crucible should be large enough to receive the substances while maintaining the crucible spherical. For example, the diameter of the crucible is at least twice the diameter of an opening of the crucible through which the substances are inserted.

The resulting material of both methods are an aggregate of single crystalline material. The resulting material of either product may then be processed into an optical media. The material may also be used as a protective coating on metal or ceramics. This may be a crystal, wafer, rod or a fiber. No cladding or other treatment is necessary to obtain the transmission characteristics briefly described.

These and other aspects of the present invention will become apparent from the following detailed description of the invention, when considered in conjunction with accompanying drawings.

BRIEF DESCRIPTION OF THE DRAWINGS

FIG. 7C is a micro-spectrophotograph of single crystalline structures after processing at 5 micron resolution.

DETAILED DESCRIPTION OF THE PREFERRED EMBODIMENTS

Figure 1:
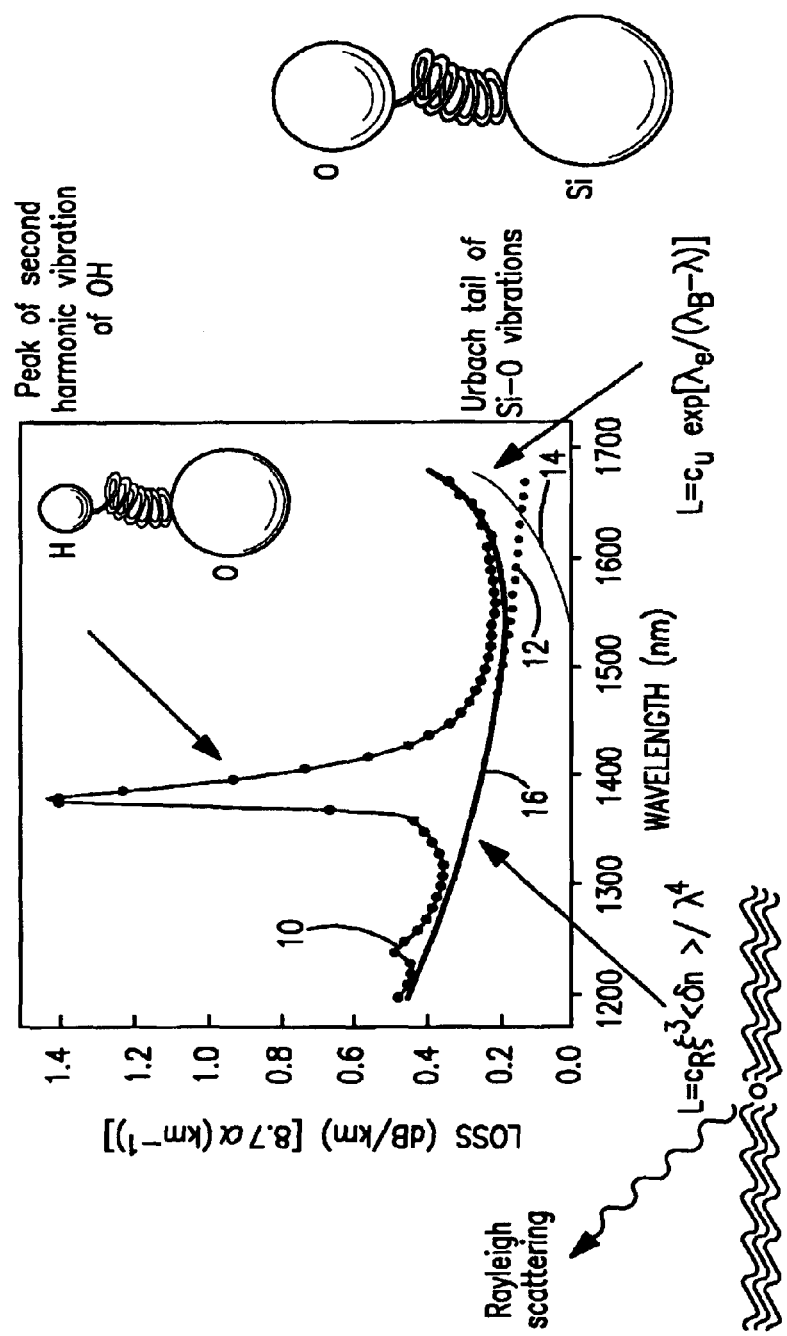
FIG. 1 is a graph illustrating the transmission loss per wavelength in a standard mode silica optical fiber as the signal propagate in the fiber.
Figure 2A:
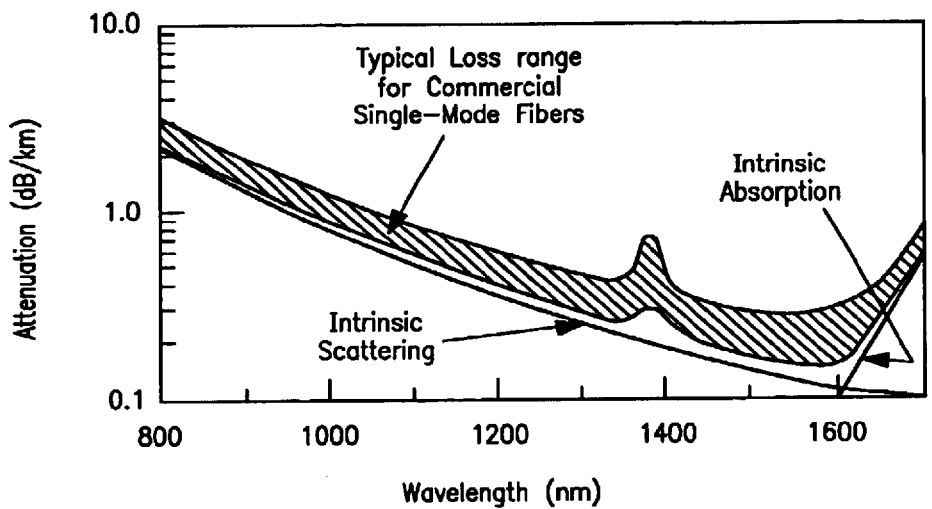
FIG. 2A is another graph illustrating the loss mechanism on a spectral wavelength of standard mode silica optical fibers.
Figure 2B:
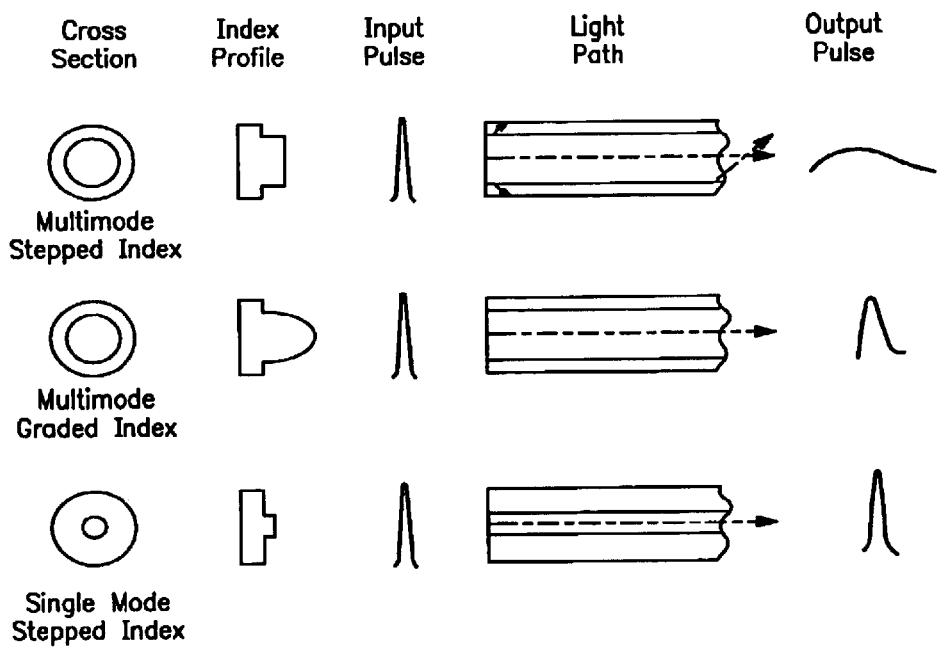
FIG. 2B is a comparison of the modal dispersion of transmitted signals in multimode and single-mode fibers.
Figure 3:
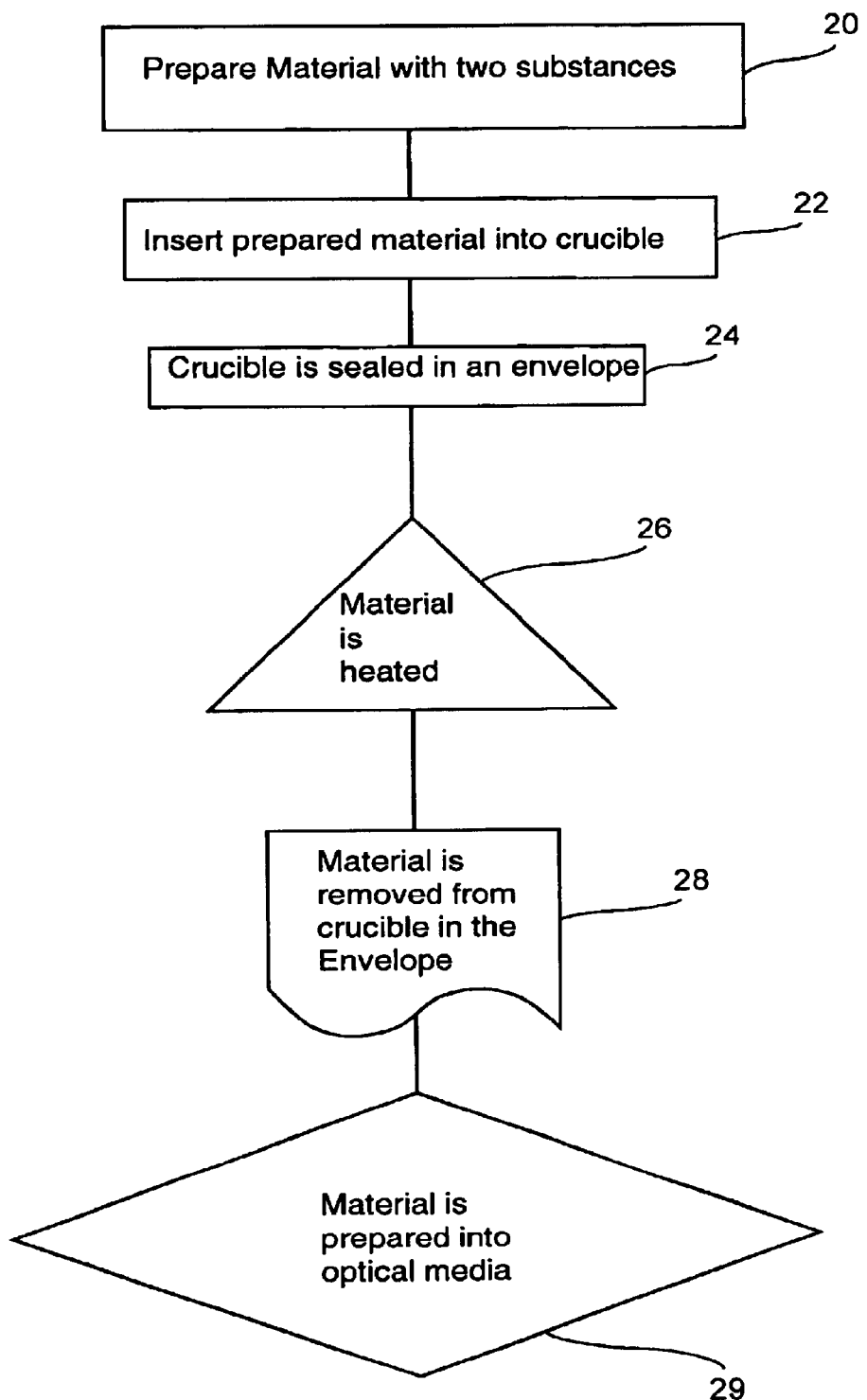
FIG. 3 is a flow chart of a process according to the present invention.

The process as illustrated in FIG. 3 includes preparing the mixture of the two components at 20 which are to form the single crystalline material. The prepared material is then inserted in a crucible at 22. The crucible is sealed in an envelope at 24. The material is heated at 26 at a temperature and time sufficient to cause a single crystalline material of two substances to form. The time and temperature should be sufficient to cause all the material to form the single crystalline structure. The material is removed from the crucible in an envelope at 28. The single crystalline material can then be processed into an optical transfer medium at 29.

Figure 4A:
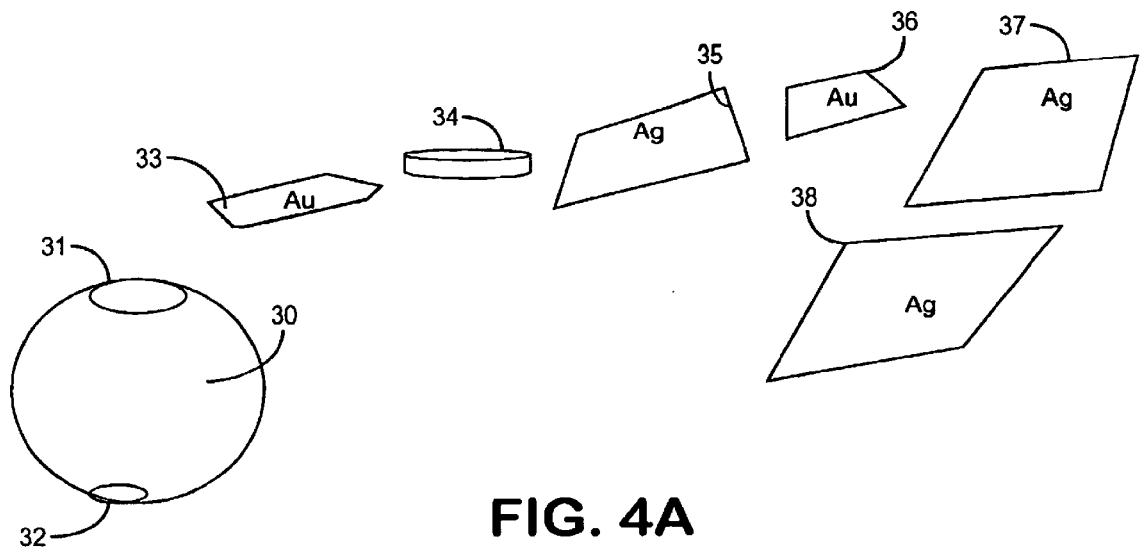
FIG. 4A is an exploded view of the crucible and the substances as part of the loading process according to the present invention.
Figure 4B:
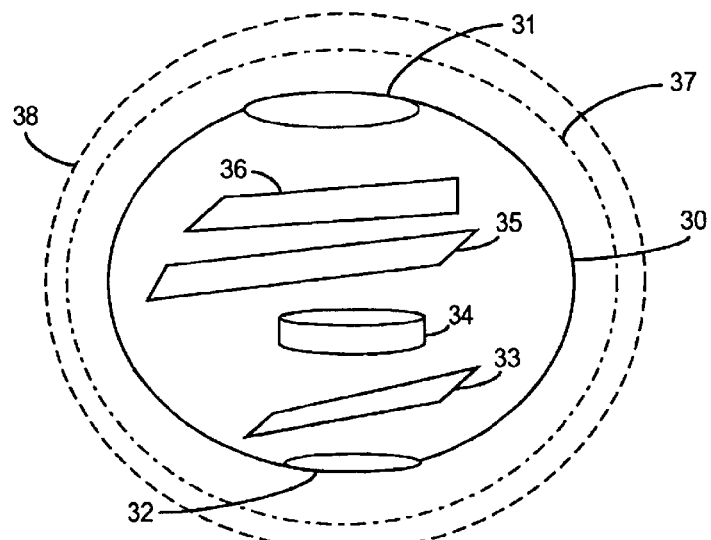
FIG. 4B is an assembled view of the crucible and the substances for FIG. 4A.

An example of a crucible is illustrated in FIGS. 4A and B as a hollow ball or sphere 30. The ball or sphere 30 has at least one opening 31. In the experiments run, the commercially available crucible 30 had a second opening 32. Since a second opening 32 was in the crucible 30, both openings 31 and 32 must be closed off in order to maintain the materials in the crucible. For the experiments run, as illustrated in FIGS. 4A and B, one sheets of material 33 provided to cap opening 32. For example, the sheet 33 may be gold. If the second opening 32 does not exist, sheets 33 can be eliminated. Sample 34 is then put into crucible 30 and covered by sheet 35 and 36. For example, the sheets 35 and 36 may be silver or gold. Finally, the total crucible 30 is wrapped in two sheets 37 and 38, which may be silver. The resulting structure is illustrated in a cross-section in FIG. 4B.

The opening 31 in the crucible 30 should be large enough to receive the substances while maintaining the crucible spherical.

It should be noted that the material for the crucible 30 may be quartz, or gold, or silver, or other materials. Also, the covering materials 33,35,36 may also be quartz gauze, for example.

Figures 5A, 5B, 5C:
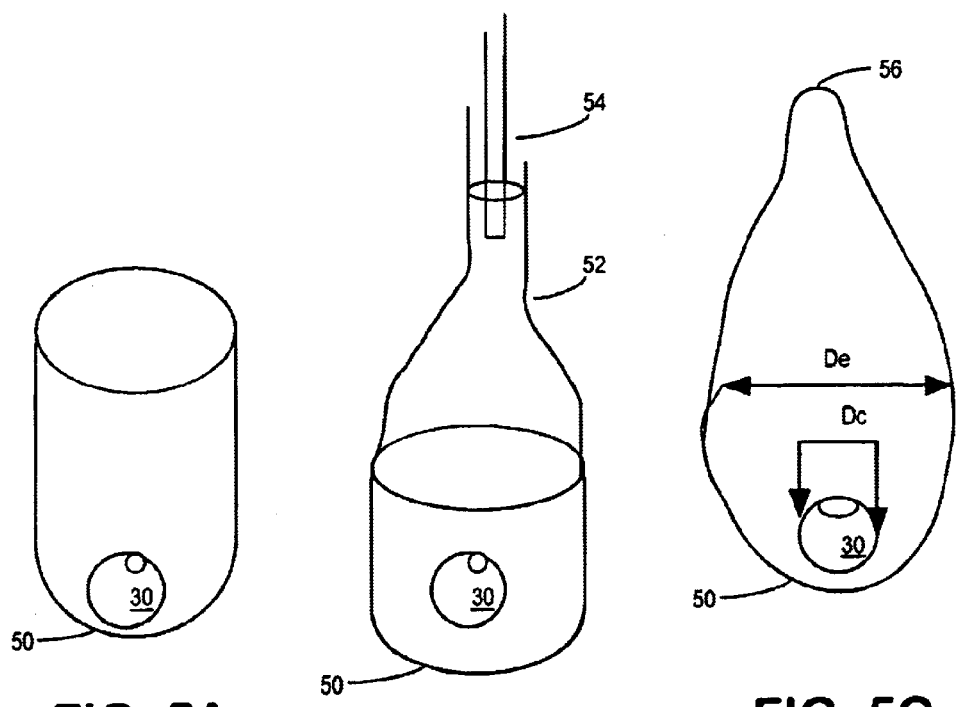
FIGS. 5A–5C show the process of enclosing the crucible in the envelope according to the present invention.

The wrapped crucible 30 is then placed in an envelope 50, as illustrated in FIG. 5A. The envelope 50 is neck down at 52 and receives a tube 54 as shown in FIG. 5B. The interior of the envelope 50 is evacuated. The tube is removed from the envelope 50 and it is sealed at 56 as shown in FIG. 5C. The resulting structure is a generally spherical shape which resembles a tear drop. The processing of the envelope 50 to form the down 52 and closing it at 56 is performed with heat in a two-step method and sufficiently slow as not to preheat or affect the material in the crucible 30. The envelope 50 may be quartz, for example.

As an example, the crucible 30 may be a ball or sphere having a diameter Dc of approximately 12 millimeter with at least one opening 32,33 having a diameter of approximately 3.5 millimeters. The diameter of the crucible Dc should be at least twice the diameter of the opening Do so as to maintain the spherical shape of the crucible. The resulting envelope 50 may have a diameter De of approximately 22 millimeters and a height of 50.8 millimeters. The thickness of the envelope 50 maybe approximately 1 millimeter.

Envelope 50 with a crucible 30 and the sample 34 therein is then inserted into an oven. It is heated at a sufficient temperature and time to create a single crystalline material of the sample or two substances. The time should also be sufficient such that all of the material forms a single crystalline material. The structure is an aggregate of the single crystals.

To continue the example, the sample 34, crucible 30 and envelope 50 may be encased in a canister prior to being inserted into the oven. For this experiment, it was placed in a canister of nuclear industrial grade pipe steel. This is to protect the oven from any debris during the heating process. Also, it has been found that the canister extends the cooling time since it is also heated.

The canister is inserted into a cold oven. The oven was set, for example, to 800 degrees centigrade. The material was then cooked for five hours and then shut down to cool off. The cooling off period was until it was cool to the touch. This cool period was approximately 10 hours. The envelope 50 was cracked open. The temperature may be in a range of approximately 700 to 1000 degrees centigrade and the time in a range of approximately 3.5 to 7 hours. The temperature range may be above and or below the ionization temperature of the substances and be sufficient to generate single crystalline material. The specific time and temperature may depend on the material of the sample and the characteristics of the oven.

The example was used to form hydroxyl ion resistant silicon dioxide. For example, the molar proportions were $SiO_2Te_{4/3}$. As an example in making one gram of final product, 0.260 grams of silicon dioxide is combined with 0.38 grams of tellurium. The mixture is prepared by putting the two substances in, for example, an Agate mortar. The processed material is then formed into a tablet in a press. All or a portion of the tablet may be inserted into a crucible. For the time and temperature given, half of the tablet was used.

Figure 6:
FIG. 6 is an enlarged view of the resulting aggregate material with a broken crucible.

The results are illustrated in FIG. 6. Crucible 30 is shown as dark gray and the aggregate of the resulting material 60 is also shown in the ball as well as outside the ball. The aggregate had a whitish/grayish/brownish coloration with no distinct indication of separate silica and tellurium. The aggregate was somewhat brittle with crystalline surface observed in a microscope inspection. The single crystalline in a structure was twined. It had a twining angle of 90°.

Figure 7A:
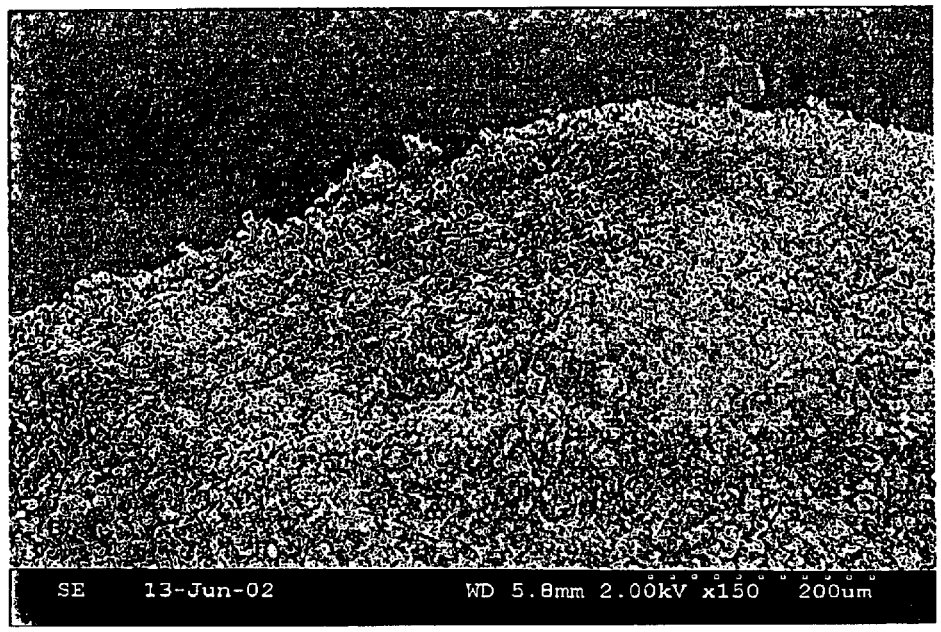
FIGS. 7A and 7B are scanning electron microscope photographs showing the aggregate of single crystalline structures at 200 and 20 micron resolution respectively.
Figure 7B:
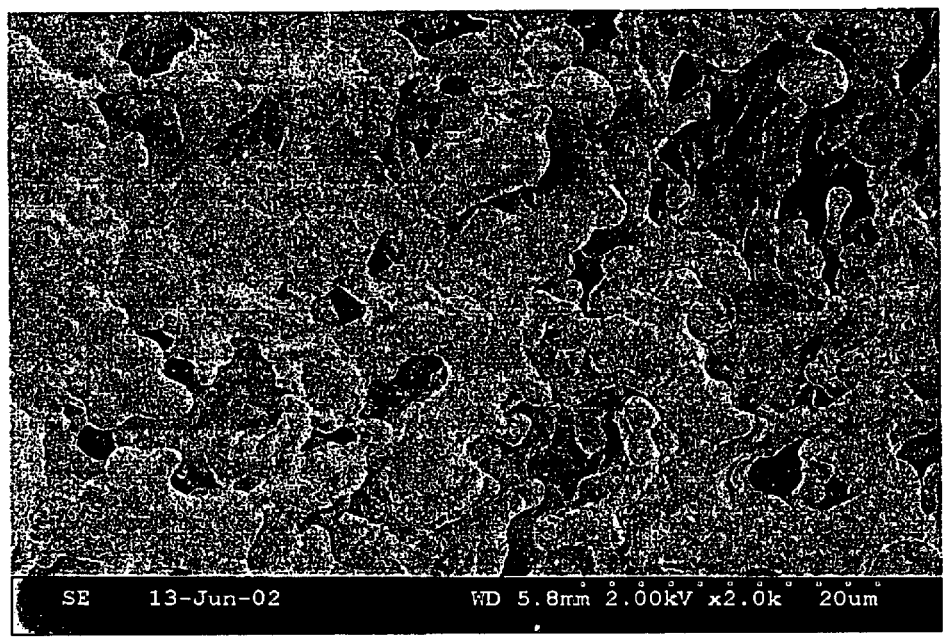

Examples of the single crystalline $SiO_2Te_{4/3}$ distribution of in the aggregate is shown in the FIGS. 7A and 7B from a scanning electron microscope at 200 and 20 micron resolution respectively. FIG. 7C shows a micro-spectrophotograph of single crystalline structures of $SiO_2Te_{3/4}$ at 5 micron resolution after material scraped from the aggregate and then crushed or powdered. The black box is 5 microns on each side for a point of reference. The average micro-crystal size was 1 micrometer.

A x-ray diffraction test was performed to determine the structures present in the powder single crystalline material.

As is noted, the identified crystal structures are: alpha-low quartz ($SiO_2$), alpha-low cristobalite ($SiO_2$), and an unidentified material structure. The closest recognizable material crystal structure to the unrecognizable material crystal structure based on a rerun of the results of the diffraction test using a greater variance is that of zinc oxide (ZnO). A comparison of the lattices of alpha low quartz, alpha low cristobalite and zinc oxide shows that the zinc oxide is hexagonal pyramidal, twined base to base while quartz is also hexagonal and cristobalite is cubic or tetragonal.

It should also be noted that quartz and cristobalite are tektosilicates. In nature they require temperatures above 1400 degrees centigrade and extreme pressure to form. The present method was performed well below this temperature and in a vacuum.

The resulting material can then be powdered or processed through a high-pressure press into a thin wafer, rod, cable or fiber form. No high heating step is required. Alternatively, it may be melted into a pre-form of a desired shape, pulled or further processed like other silicon dioxide materials. The single crystalline structure will not be altered by the pressing or the melting.

Figure 9:
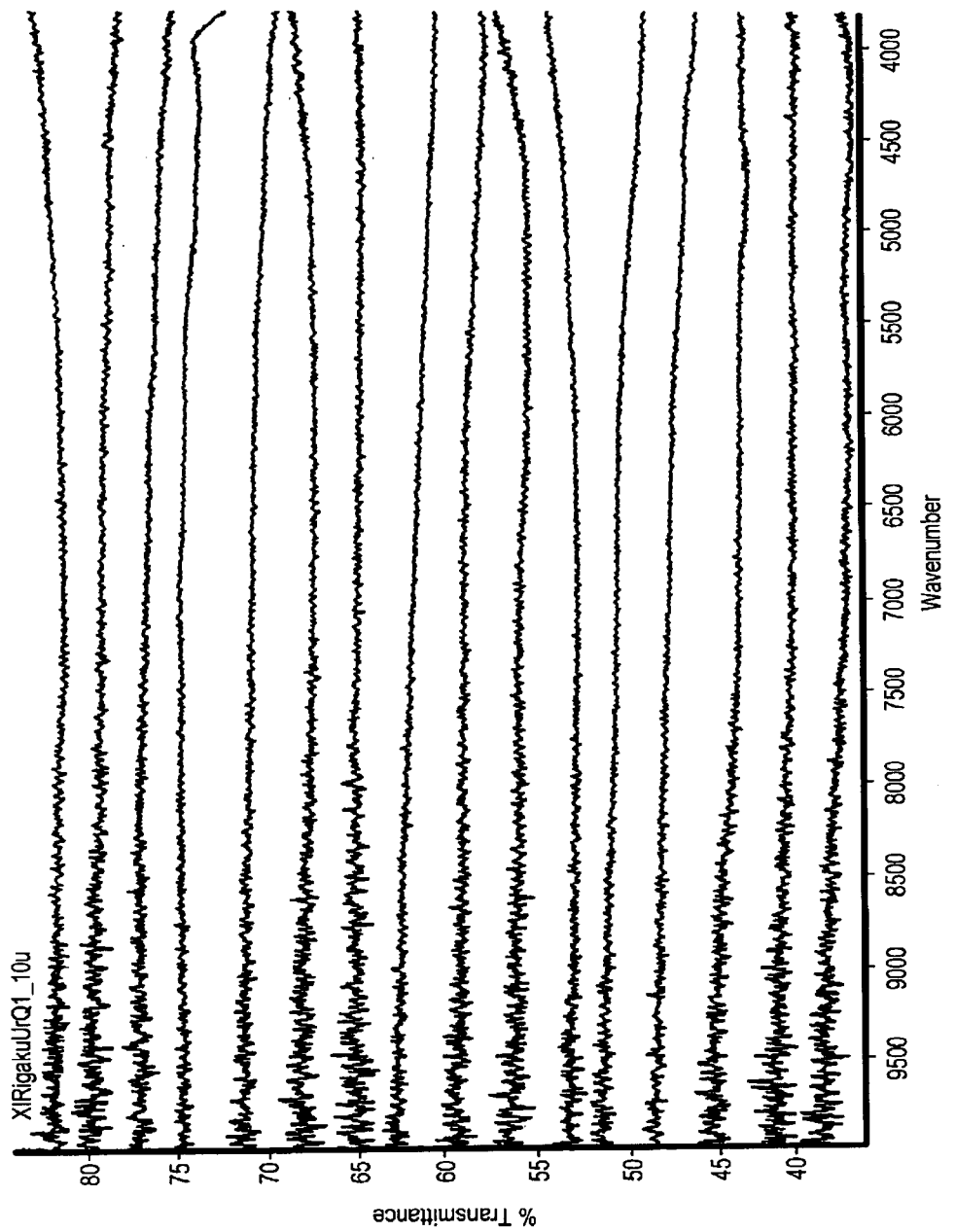
FIG. 9 is a FTIR transmission response of sixteen crystals of the material of FIGS. 7C and 8.

FIG. 9 shows the loss transmission of 16 samples of the above experiment as a function of wave number measure by an FTIR. The vertical scale is not a continuous percentage of loss, but is intended to show the substantially linear and/or flat response. Each vertical scale mark is 5%. Wave numbers 7000 to 5000 correspond to the 1,000 nanometer to 2,000 nanometer wavelengths. There is no spike due to the second harmonic of the hydroxyl ion, and there is no Urbach tail.

Figure 10:
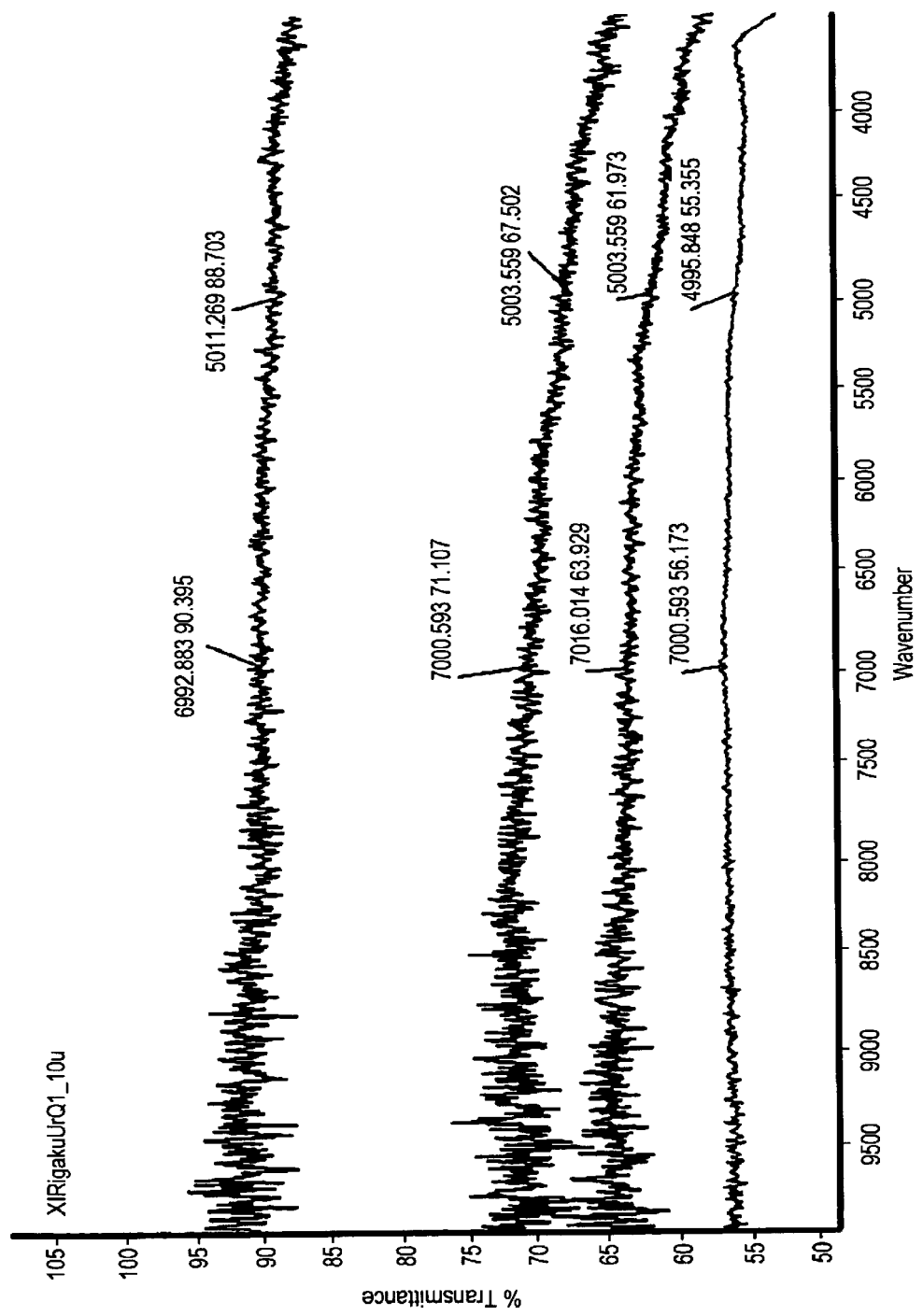
FIG. 10 is a FTIR transmission response of three of the sixteen crystals of FIG. 9.

FIG. 10 illustrates the percentage transmission versus wave number for four selected samples. Again, even though the transmittance percentage varies, all of them are substantially flat. The difference in the transmittance is from the processing of the resulting material prior to the transmittance test. When the sample was pressed to a finer powder and less grainy, the transmission improved. An important aspect is that the response is flat and further techniques in preparing the sample for the measurement is expected to result in substantially 100 percent transmittance.

The formation of $SiO_2Te_{4/3}$ is a new material produced by the present process, but the process may be used to produce other single crystal compounds of two substances. The material may be $SiO_2Te_x$ where x is in the range of 1/3 to 5/3. The single crystalline material may be other silicon based materials for example silicon and telluride. The above process was conducted for $SiTe_2$ and produced similar results. But these are just examples and the process can be used with other substances.

It should also be noted that experiments have been conducted using silicon and silicon dioxide with tellurium in a rectangular crucible and a test tube shaped envelope at the same temperatures and times of the above example, but did not achieve the same results. Very few single crystals of the combined material were formed. The generally spherical shape of the crucible and the envelope produced the increased crystallization of all the material.

Not only is the material made from the present process OH resistant, but it is $H_2O$ and H. Thus, the present material may be used as a barrier on substrates, such as metal, ceramic or other surfaces, to protect against OH, $H_2O$ and H. The material would be powdered as previously discussed and applied to the surface of the metal or ceramics by known techniques depending on the metal or ceramic. This will prevent oxidation, surface defect and cracking of the surface of the metal and defects or cracking of the ceramic. The same is true for integrated circuit substrates and various metallic layers thereon.

Although the present invention has been described and illustrated in detail, it is to be clearly understood that this is done by way of illustration and example only and is not to be taken by way of limitation. The spirit and scope of the present invention are to be limited only by the terms of the appended claims.

REFERENCES

1. Gordon A. Thomas, et al., *Physics in the Whirlwind of Optical Communications*, Physics Today, pp. 30–36, September 2000.

2. *Infrared Fiber Optics*, Naval Research Laboratory, Washington, D.C.

3. Ranka et al., U.S. Pat. No. 6,400,866 (Jun. 4, 2002).

4. P. Fernández de Cordoba, et al., *La nueva generación de fibras ópticas*, El País, Jun. 5, 2002.

5. E. G. Doni-Caranicola, et al., *Use of single $SiTe_2$ crystals with a layered structure in optical filter design*, J. Opt. Soc. Am., pp. 383–386 (1983).

6. A. P. Lambros, et al., *The Optical Properties of Silicon Ditelluride*, Phys. Status Solidi (b), Vol. 57, No. 2, pp. 793–799 (1973).

7. Kazuhisa Taketoshi, et al., *Structural Studies on Silicon Ditelluride ($SiTe_2$)*, Jpn. J. Appl. Phys., Vol. 34, pp. 3192–3197 (1995).

What is claimed:

1. A method of forming a single crystalline structure of two substances comprising:
    inserting the two substances into a substantially spherical crucible;
    sealing the crucible in a substantially spherical envelope; and
    heating the two substances in an oven at an oven temperature below the melting and vaporizing temperature of at least one of the substances and time sufficient to create a single crystalline material of the two substances.

2. The method of claim 1, wherein the two substances are a silicon based substance and tellurium.

3. The method of claim 2, wherein the amount of silica and tellurium inserted is selected to form $SiO_2Te_x$ where x is in the range of 1/3 to 5/3.

4. A method of forming a single crystalline structure of two substances comprising:
    inserting the two substances into a substantially spherical crucible:
    sealing the crucible in a substantially spherical envelope; and
    heating the two substances in an oven at an oven temperature and time sufficient to create a single crystalline material of the two substances;
    wherein the method forms the single crystalline material having twin crystal structures.

5. The method of claim 4, wherein the twin crystal structures have a twining angle of 90 degrees.

6. The method of claim 1, wherein the diameter of the crucible is at least twice the diameter of an opening of the crucible through which the substances are inserted.

7. The method of claim 1, wherein the crucible is one of quartz and gold.

8. The method of claim 1, including covering an opening of the crucible through which the substances are inserted.

9. The method of claim 1, wherein the heating is performed until all the material form a single crystalline material of the two substances.

10. A method of forming a single crystalline structure of two substances comprising:
inserting the two substances into a substantially spherical crucible;
sealing the crucible in a substantially spherical envelope; and
heating the two substances in an oven at an oven temperature and time sufficient to create a single crystalline material of the two substances;
wherein the heating is at an oven temperature below the ionization temperature of the two substances.

11. The method of claim 2, wherein the heating is at an oven temperature in the range of 700 to 1000 degrees centigrade.

12. A method of forming a single crystalline structure of two substances comprising:
inserting the two substances into a substantially spherical crucible;
sealing the crucible in a substantially spherical envelope; and
heating the two substances in an oven at an oven temperature and time sufficient to create a single crystalline material of the two substances;
wherein the method forms an aggregate of a single crystalline material of the two substances.

13. The method of claim 1, wherein one of the substances includes silicon.

14. A method of forming a single crystalline structure having a substantially linear response at least over the wave lengths of 1,200 to 1,700 nanometers comprising:
inserting two substances into a crucible;
sealing the crucible in an envelope;
heating the two substances in an oven at a temperature and time sufficient to create a single crystalline material of the two substances having a substantially linear response at least over the wave lengths of 1,200 to 1,700 nanometers.

15. The method of claim 14, wherein the two substances are a silicon base substance and tellurium.

16. The method of claim 15, wherein the amount of silica and tellurium inserted is selected to form $SiO_2Te_x$ where x is in the range of 1/3 to 5/3.

17. The method of claim 14, wherein the method forms the single crystalline material having twin crystal structures.

18. The method of claim 17, wherein the twin crystal structures have a twining angle of 90 degrees.

19. The method of claim 14, wherein the diameter of the crucible is at least twice the diameter of an opening of the crucible through which the substances are inserted.

20. The method of claim 14, wherein the crucible is one of quartz and gold.

21. The method of claim 14, including covering an opening of the crucible through which the substances are inserted.

22. The method of claim 14, wherein the heating is performed until all the material form a single crystalline material of the two substances.

23. The method of claim 14, wherein the heating is at an oven temperature below the ionization temperature of the two substances.

24. The method of claim 14, wherein the heating is at an oven temperature in the range of 700 to 1000 degrees centigrade.

25. The method of claim 14, wherein the method forms an aggregate of a single crystalline material of the two substances.

26. The method of claim 14, wherein one of the substances includes silicon.

27. An optical media comprising:
single crystalline structures of a silicon compound having a substantially linear response at least over the wave lengths of 1,200 to 1,700 nanometers.

28. The media of claim 27, wherein the structure is $SiO_2Te_x$ where x is in the range of 1/3 to 5/3.

29. The media of claim 27, wherein the single crystalline structures have twin crystal structures.

30. The media of claim 27, wherein the twin crystal structures have a twining angle of 90 degrees.

31. The media of claim 27, wherein the structure has a substantially flat response at least over the wave lengths of 1,200 to 1,700 nanometers.

32. The media of claim 27, wherein the optical media is one or more of a fiber, rod, wafer and a crystal.

33. The media of claim 27, wherein the optical media is a wafer.

Figure 8:
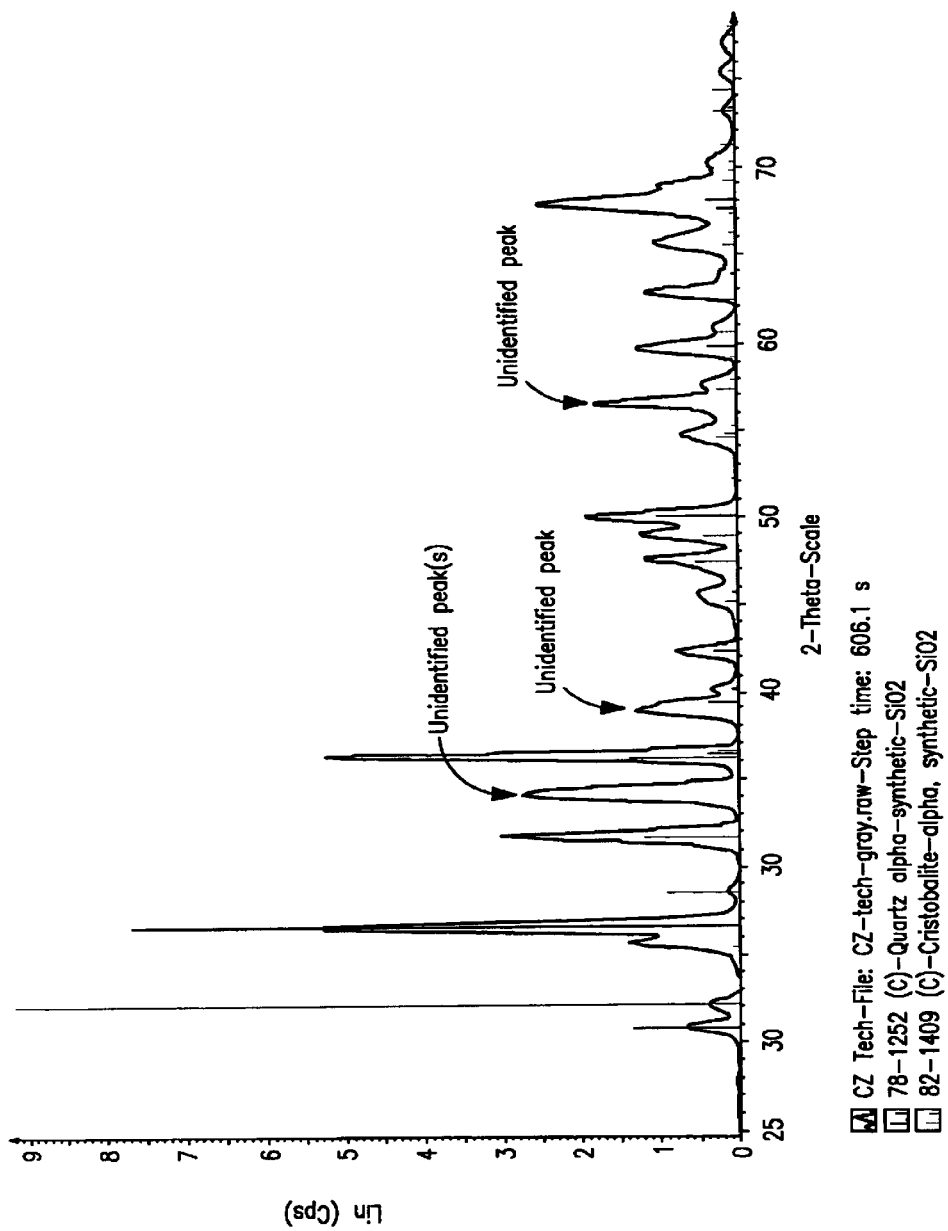
FIG. 8 is a graph of the X-Ray Diffraction showing the structures in the powder resulting material.

34. An optical media comprising:
a single crystalline structure of silica and tellurium having the structure of FIG. 8.

35. An optical media comprising:
a single crystalline structure of $SiO_2Te_x$ where x is in the range of 1/3 to 5/3.

36. A substrate having a surface coating of the material, the material comprising:
single crystalline structures of a silicon compound having a substantially linear response at least over the wave lengths of 1,200 to 1,700 nanometers.

37. The substrate of claim 36, wherein the substrate is one of metal and ceramic.

38. The method according to claim 1, including coating a substrate with the single crystalline material.

39. The method according to claim 38, wherein the substrate is one of metal and ceramic.

40. The method according to claim 1, wherein the heating is at an oven temperature below the melting and vaporizing temperature of the two substances.

41. A method of forming a single crystalline structure of two substances comprising:
inserting the two substances into a substantially spherical crucible;
sealing the crucible in a substantially spherical envelope; and
heating the two substances in an oven at an oven temperature and time sufficient to create a single crystalline material of the two substances;
wherein the envelope is tear drop shaped.

42. A substrate having a surface coating of the material, the material comprising:
a single crystalline structure of $SiQ_2Te_x$ where x is in the range of 1/3 to 5/3.

43. The substrate of claim 42, wherein the substrate is one of metal and ceramic.

* * * * *